US008830007B1

(12) United States Patent
Gamliel

(10) Patent No.: US 8,830,007 B1
(45) Date of Patent: Sep. 9, 2014

(54) ULTRA-LOW NOISE VCO

(75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 167 days.

(21) Appl. No.: 13/423,420

(22) Filed: Mar. 19, 2012

(51) Int. Cl.
*H03K 3/282* (2006.01)

(52) U.S. Cl.
USPC ............... 331/117 R; 331/117 FE; 331/167; 331/177 R

(58) Field of Classification Search
USPC ................. 331/117 R, 117 FE, 167, 177 R
See application file for complete search history.

(56) References Cited

U.S. PATENT DOCUMENTS

| | | | |
|---|---|---|---|
| 4,169,248 A | 9/1979 | Hongu | |
| 5,379,003 A | 1/1995 | Bizen | |
| 5,473,287 A * | 12/1995 | Robbins et al. | 331/99 |
| 5,714,914 A | 2/1998 | Zhou | |
| 6,075,421 A | 6/2000 | Chong | |
| 6,104,254 A | 8/2000 | Iravani | |
| 6,198,359 B1 | 3/2001 | Wichern | |
| 6,292,065 B1 | 9/2001 | Friedman | |
| 6,353,368 B1 | 3/2002 | Iravani | |
| 6,466,099 B2 | 10/2002 | Festag | |
| 6,469,587 B2 | 10/2002 | Scoggins | |
| 6,545,555 B1 | 4/2003 | Justice et al. | |
| 6,759,915 B2 * | 7/2004 | Akatsuka | 331/179 |
| 6,995,618 B1 | 2/2006 | Boecker | |
| 7,061,339 B2 | 6/2006 | Sibrai et al. | |
| 7,102,453 B1 | 9/2006 | Rohde et al. | |
| 7,414,488 B2 | 8/2008 | Lee et al. | |
| 7,532,080 B2 | 5/2009 | Rhode et al. | |
| 7,884,677 B2 | 2/2011 | Sutardja | |
| 7,990,227 B2 * | 8/2011 | Schechinger | 331/177 V |
| 2008/0174375 A1 * | 7/2008 | Nakamura et al. | 331/74 |

* cited by examiner

*Primary Examiner* — Arnold Kinkead
*Assistant Examiner* — Richard Tan
(74) *Attorney, Agent, or Firm* — Lawrence G. Fridman

(57) ABSTRACT

An ultra-low phase noise voltage controlled oscillator uses a single bipolar transistor Colpitts oscillator circuit and a noise-reducing negative feedback path consisting of a capacitor and a second element which may be a second capacitor, an inductor or a resistor. The negative feedback path is kept separate from any DC biasing paths in the circuit. A pair of varactor diodes are used to provide resonant frequency control.

12 Claims, 4 Drawing Sheets

| Vtune (V) | FREQ (MHz) | Power (dBm) | Kv (MHz/V) | Current (mA) | Pushing (KHz/V) | P.Noise @1KHz (-dBc) | P.Noise @10KHz (-dBc) | P.Noise @100KHz (-dBc) | P.Noise @1MHz (-dBc) | P.Noise @10MHz (-dBc) | F2 (dBc) | F3 (dBc) |
|---|---|---|---|---|---|---|---|---|---|---|---|---|
| 0.0000 | 359.7061 | +5.31 | 11.3530 | 21.52 | -532.20 | -87.31 | -114.40 | -135.97 | -156.31 | -171.40 | -13.90 | -36.64 |
| 0.5000 | 365.3826 | +5.52 | 8.8540 | 22.03 | -426.91 | -89.04 | -114.83 | -136.90 | -157.65 | -172.00 | -14.35 | -38.71 |
| 1.0000 | 369.8096 | +5.57 | 7.6261 | 22.14 | -294.92 | -88.38 | -115.98 | -137.65 | -158.73 | -173.74 | -14.89 | -38.60 |
| 1.5000 | 373.6227 | +5.61 | 6.8888 | 22.23 | -230.56 | -90.03 | -116.92 | -138.60 | -159.40 | -174.68 | -15.37 | -38.46 |
| 2.0000 | 377.0671 | +5.65 | 6.3965 | 22.31 | -191.86 | -89.68 | -116.15 | -138.64 | -159.28 | -173.25 | -15.65 | -39.58 |
| 2.5000 | 380.2653 | +5.68 | 6.0445 | 22.37 | -165.47 | -93.20 | -116.76 | -138.92 | -159.95 | -171.29 | -15.76 | -40.72 |
| 3.0000 | 383.2876 | +5.70 | 5.7868 | 22.42 | -145.39 | -90.46 | -117.93 | -139.41 | -159.93 | -171.67 | -15.84 | -40.97 |
| 3.5000 | 386.1810 | +5.72 | 5.5928 | 22.47 | -129.21 | -89.53 | -117.55 | -139.38 | -159.61 | -172.24 | -15.99 | -40.73 |
| 4.0000 | 388.9774 | +5.74 | 5.4436 | 22.52 | -116.03 | -91.76 | -117.77 | -139.39 | -160.54 | -172.95 | -16.28 | -40.93 |
| 4.5000 | 391.6991 | +5.76 | 5.3341 | 22.56 | -104.49 | -92.53 | -117.83 | -139.34 | -159.51 | -172.42 | -16.70 | -41.49 |
| 5.0000 | 394.3662 | +5.77 | 5.2543 | 22.60 | -93.93 | -91.64 | -117.92 | -139.35 | -159.40 | -171.80 | -17.13 | -41.82 |
| 5.5000 | 396.9933 | +5.78 | 5.1986 | 22.64 | -84.32 | -92.05 | -117.89 | -139.51 | -160.04 | -171.87 | -17.48 | -41.62 |
| 6.0000 | 399.5927 | +5.79 | 5.1653 | 22.68 | -74.86 | -91.62 | -117.62 | -139.63 | -159.93 | -170.46 | -17.72 | -41.58 |
| 6.5000 | 402.1753 | +5.80 | 5.1498 | 22.73 | -65.92 | -94.56 | -117.60 | -139.43 | -159.95 | -173.15 | -17.89 | -42.19 |
| 7.0000 | 404.7502 | +5.81 | 5.1460 | 22.77 | -57.98 | -87.90 | -117.21 | -139.59 | -161.00 | -172.02 | -17.99 | -43.28 |
| 7.5000 | 407.3232 | +5.81 | 5.1604 | 22.80 | -50.72 | -92.24 | -117.22 | -139.57 | -159.79 | -174.02 | -18.16 | -44.33 |
| 8.0000 | 409.9034 | +5.82 | 5.1881 | 22.84 | -43.70 | -92.24 | -117.44 | -139.64 | -159.99 | -171.75 | -18.44 | -44.81 |
| 8.5000 | 412.4974 | +5.83 | 5.2217 | 22.88 | -37.81 | -90.63 | -117.31 | -139.44 | -159.70 | -172.45 | -18.78 | -44.69 |
| 9.0000 | 415.1082 | +5.83 | 5.2640 | 22.91 | -33.05 | -93.61 | -117.80 | -139.67 | -160.50 | -171.15 | -19.14 | -45.03 |
| 9.5000 | 417.7402 | +5.84 | 5.3110 | 22.95 | -30.70 | -91.50 | -117.79 | -139.26 | -159.19 | -172.28 | -19.43 | -46.31 |
| 10.0000 | 420.3957 | +5.84 | 5.3536 | 22.98 | -32.01 | -90.77 | -116.61 | -139.26 | -159.41 | -171.66 | -19.59 | -47.94 |
| 10.5000 | 423.0725 | +5.84 | 5.3898 | 23.01 | -38.06 | -89.71 | -116.27 | -138.83 | -159.15 | -172.88 | -19.67 | -48.62 |
| 11.0000 | 425.7674 | +5.85 | 5.4144 | 23.03 | -50.90 | -88.19 | -117.03 | -138.77 | -159.46 | -171.45 | -19.64 | -47.52 |
| 11.5000 | 428.4746 | +5.85 | 5.4120 | 23.05 | -73.00 | -89.41 | -115.82 | -138.38 | -158.85 | -172.04 | -19.70 | -46.57 |
| 12.0000 | 431.1806 | +5.84 | 5.3727 | 23.07 | -107.06 | -86.22 | -115.66 | -138.10 | -158.52 | -171.53 | -19.84 | -47.39 |
| 12.5000 | 433.8669 | +5.84 | 5.2839 | 23.08 | -155.33 | -87.63 | -115.37 | -137.41 | -157.70 | -173.13 | -19.93 | -49.50 |
| 13.0000 | 436.5089 | +5.84 | 5.1366 | 23.10 | -217.44 | -87.04 | -114.64 | -136.95 | -157.48 | -172.51 | -20.71 | -51.22 |
| 13.5000 | 439.0772 | +5.84 | 4.9352 | 23.11 | -288.97 | -88.05 | -113.59 | -136.21 | -156.48 | -171.65 | -21.35 | -50.59 |
| 14.0000 | 441.5448 | +5.84 | 4.6794 | 23.11 | -362.64 | -85.25 | -113.22 | -135.38 | -155.92 | -173.53 | -21.74 | -49.31 |
| 14.5000 | 443.8845 | +5.83 | 4.3765 | 23.11 | -429.69 | -83.58 | -112.49 | -134.91 | -155.61 | -171.19 | -21.90 | -49.08 |
| 15.0000 | 446.0727 | +5.82 | 4.3765 | 23.11 | -480.26 | -86.33 | -112.37 | -134.37 | -155.34 | -171.49 | -21.89 | -50.21 |

FIG. 3

| Vtune (V) | FREQ (MHz) | Power (dBm) | Kv (MHz/V) | Current (mA) | Pushing (KHz/V) | P.Noise @1KHz (-dBc) | P.Noise @10KHz (-dBc) | P.Noise @100KHz (-dBc) | P.Noise @1MHz (-dBc) | P.Noise @10MHz (-dBc) | F2 (dBc) | F3 (dBc) |
|---|---|---|---|---|---|---|---|---|---|---|---|---|
| 0.0000 | 358.1448 | +2.68 | 10.9656 | 18.77 | -519.62 | -88.19 | -116.40 | -138.35 | -158.69 | -170.84 | -15.56 | -45.11 |
| 0.5000 | 363.6276 | +2.86 | 8.5875 | 18.95 | -314.61 | -93.79 | -119.69 | -141.23 | -162.44 | -171.84 | -15.20 | -45.58 |
| 1.0000 | 367.9214 | +2.96 | 7.4378 | 19.05 | -211.46 | -95.80 | -121.63 | -142.96 | -162.69 | -169.30 | -15.72 | -45.28 |
| 1.5000 | 371.6403 | +3.03 | 6.7363 | 19.12 | -158.94 | -94.84 | -122.34 | -143.91 | -163.60 | -172.15 | -16.52 | -44.34 |
| 2.0000 | 375.0084 | +3.09 | 6.2632 | 19.18 | -125.89 | -95.77 | -122.61 | -143.69 | -163.18 | -171.46 | -17.11 | -44.61 |
| 2.5000 | 378.1400 | +3.14 | 5.9213 | 19.24 | -102.97 | -96.01 | -122.92 | -144.05 | -162.50 | -170.54 | -17.21 | -45.88 |
| 3.0000 | 381.1007 | +3.19 | 5.6690 | 19.29 | -85.45 | -96.02 | -124.08 | -144.82 | -164.10 | -172.54 | -17.09 | -46.69 |
| 3.5000 | 383.9352 | +3.23 | 5.4784 | 19.33 | -71.29 | -96.30 | -124.05 | -144.78 | -165.44 | -173.10 | -16.87 | -46.80 |
| 4.0000 | 386.6744 | +3.27 | 5.3324 | 19.37 | -59.66 | -97.02 | -123.90 | -144.64 | -165.37 | -171.98 | -16.91 | -46.78 |
| 4.5000 | 389.3406 | +3.30 | 5.2244 | 19.40 | -49.56 | -96.84 | -123.79 | -144.66 | -163.84 | -171.47 | -17.38 | -47.01 |
| 5.0000 | 391.9528 | +3.33 | 5.1446 | 19.44 | -40.77 | -100.27 | -123.95 | -144.76 | -164.68 | -171.08 | -18.02 | -47.29 |
| 5.5000 | 394.5251 | +3.36 | 5.0880 | 19.47 | -32.90 | -98.61 | -123.53 | -144.92 | -165.68 | -172.21 | -18.55 | -47.02 |
| 6.0000 | 397.0691 | +3.39 | 5.0531 | 19.50 | -25.60 | -100.13 | -125.18 | -144.64 | -163.53 | -169.76 | -18.89 | -46.33 |
| 6.5000 | 399.5956 | +3.41 | 5.0371 | 19.54 | -18.95 | -96.58 | -124.18 | -144.81 | -164.59 | -172.19 | -18.88 | -45.86 |
| 7.0000 | 402.1141 | +3.44 | 5.0337 | 19.57 | -12.69 | -98.57 | -124.38 | -145.50 | -165.37 | -173.22 | -18.65 | -46.08 |
| 7.5000 | 404.6310 | +3.46 | 5.0464 | 19.60 | -6.74 | -98.78 | -124.63 | -144.58 | -165.03 | -171.10 | -18.36 | -46.63 |
| 8.0000 | 407.1542 | +3.48 | 5.0714 | 19.63 | -1.37 | -98.24 | -124.58 | -144.56 | -164.29 | -171.02 | -18.33 | -47.05 |
| 8.5000 | 409.6898 | +3.50 | 5.1031 | 19.65 | +3.42 | -96.53 | -124.84 | -144.60 | -164.03 | -171.34 | -18.67 | -46.94 |
| 9.0000 | 412.2415 | +3.52 | 5.1445 | 19.68 | +7.08 | -96.55 | -124.52 | -144.91 | -164.28 | -171.83 | -19.37 | -46.77 |
| 9.5000 | 414.8137 | +3.54 | 5.1906 | 19.70 | +9.31 | -99.59 | -124.67 | -144.53 | -163.10 | -172.59 | -20.13 | -47.07 |
| 10.0000 | 417.4090 | +3.56 | 5.2350 | 19.73 | +8.91 | -100.88 | -123.93 | -144.50 | -165.20 | -171.91 | -20.64 | -48.30 |
| 10.5000 | 420.0265 | +3.58 | 5.2749 | 19.74 | +4.88 | -98.86 | -123.91 | -144.55 | -161.94 | -171.57 | -20.93 | -49.62 |
| 11.0000 | 422.6639 | +3.60 | 5.3027 | 19.77 | -4.52 | -98.79 | -124.09 | -144.21 | -163.55 | -169.67 | -20.82 | -50.12 |
| 11.5000 | 425.3153 | +3.61 | 5.3073 | 19.78 | -22.00 | -96.55 | -123.60 | -144.18 | -162.99 | -170.05 | -20.47 | -49.57 |
| 12.0000 | 427.9690 | +3.61 | 5.2774 | 19.79 | -50.05 | -96.75 | -123.43 | -143.73 | -163.43 | -172.84 | -20.13 | -49.07 |
| 12.5000 | 430.6076 | +3.61 | 5.1999 | 19.80 | -91.16 | -94.61 | -122.27 | -143.77 | -162.49 | -170.77 | -20.15 | -49.51 |
| 13.0000 | 433.2076 | +3.61 | 5.0630 | 19.80 | -146.45 | -95.20 | -121.91 | -142.90 | -162.34 | -171.65 | -20.60 | -50.75 |
| 13.5000 | 435.7391 | +3.60 | 4.8660 | 19.80 | -212.74 | -96.20 | -120.86 | -142.32 | -161.94 | -172.01 | -21.30 | -51.66 |
| 14.0000 | 438.1721 | +3.59 | 4.6080 | 19.79 | -282.93 | -92.79 | -120.41 | -141.73 | -161.93 | -172.79 | -21.90 | -51.59 |
| 14.5000 | 440.4761 | +3.57 | 4.2940 | 19.78 | -348.11 | -90.93 | -118.79 | -141.09 | -161.50 | -171.49 | -22.27 | -50.95 |
| 15.0000 | 442.6231 | +3.55 | 4.2940 | 19.77 | -397.89 | -92.57 | -118.70 | -140.64 | -160.78 | -172.12 | -22.47 | -50.62 |

FIG. 4

ULTRA-LOW NOISE VCO

BACKGROUND OF THE INVENTION

1. Field of the Invention

The present invention relates generally to voltage controlled oscillators (VCOs) and more particularly to a VCO using a single transistor Colpitts oscillator circuit and having a negative feedback network configured to provide ultra-low phase noise.

2. Description of the Prior Art

A VCO is an electronic circuit with an oscillator having a frequency control input whereby a control voltage can vary the frequency of oscillation. Numerous types of oscillators can be used in VCOs, each with specific advantages and constraints. VCOs often serve as building blocks for more complex circuits, including phase-locked loops and voltage-to-frequency converters. VCOs and circuits incorporating them are used in cellphones and other radio communication devices, and with ever-increasing demands for wireless device performance are subject to ever-increasing requirements for performance and efficiency.

The oscillator circuit in a simple VCO generally is a harmonic oscillator consisting of an amplifier that provides adequate gain and a resonant circuit that feeds back signal to the input. Often the resonant circuit is an LC tank circuit having in its simplest form a capacitor and inductor. Oscillation occurs at the resonant frequency where a positive gain arises around the loop. A commonly used type of oscillator is the Colpitts oscillator, wherein two capacitors and a single inductor determine the frequency of oscillation around a single transistor. The positive feedback needed for oscillation is taken from a voltage divider made from the two capacitors. A well-known method for using a voltage to control the oscillation frequency is by using a voltage-controlled capacitor, also known as a varactor. Any reverse-biased semiconductor diode has some amount of voltage-dependent capacitance and can be used to change the frequency of an oscillator by varying a control voltage applied to the diode. Special-purpose variable capacitance varactor diodes are available with well-characterized wide-ranging values of capacitance and are frequently used in the fabrication of VCOs.

As with any electronic device, a VCO has inherent noise sources. A VCO noise source of major concern in radio applications is phase noise, which is also described as short-term frequency stability. Phase noise is undesirable because the phase noise components of a signal at a desired frequency spread the power of the signal to adjacent frequencies, resulting in noise sidebands and reducing power at the desired frequency. Phase noise in VCOs can be reduced by careful selection of active components and by various circuit design strategies, generally including the addition of a negative feedback loop from the oscillator output back to the oscillator input.

U.S. Pat. No. 5,714,914 entitled HIGH POWER LOW-NOISE VOLTAGE-CONTROLLED OSCILLATOR teaches a VCO comprising a resonant circuit, an active circuit including a transistor connected in a Colpitts configuration, and a buffer amplifier. The oscillation frequency control voltage is applied directly to the cathode of a single varactor diode. The noise reduction strategy for this single-transistor oscillator includes having capacitances connected in parallel with the junction capacitances of the transistor, each capacitance being greater than the respective junction capacitance and serving to suppress feedback at low frequencies. A resistor is also provided to supply negative feedback and suppress gain and noise at low frequencies. In this circuit, low frequencies are defined as frequencies far below the VCO's oscillation frequency. However, the disadvantage of this VCO is that the additional capacitances thereof limit the application at high frequencies as the capacitances may result in the cessation of oscillation.

U.S. Pat. No. 6,075,421 entitled VOLTAGE CONTROLLED OSCILLATOR teaches a Hartley configuration VCO comprising a voltage controllable variable resonant circuit, an amplifier, a positive feedback path and a frequency dependent negative feedback path. The frequency control voltage is applied through an inductor to the common cathodes of a pair of varactor diodes. This VCO is taught with two parallel coupled transistors but the general topology would be equally valid for a single transistor or for more than two transistors coupled in parallel. For purposes of simplicity, the parallel-connected nodes of the transistors will be referred to in the singular. The emitter node of the transistors is the positive feedback node and the collector node of the transistors is the negative feedback node. The frequency dependent negative feedback path consists of a capacitor and inductor in series between the collector and the base of the transistors, with a DC biasing resistor connected intermediate the feedback capacitor and feedback inductor.

Disadvantages of this VCO include the level of phase noise reduction provided, disclosed to be less than −130 dBc/Hz at any frequency shown. Additionally, use at high frequencies may be limited because when more transistors are required more pads are required with the concomitant result of increasing parasitic effects. Further, the negative feedback circuit is combined with the DC biasing circuit, thus constraining both the biasing and negative feedback topologies.

U.S. Pat. No. 6,353,368 entitled VCO CIRCUIT USING NEGATIVE FEEDBACK TO REDUCE PHASE NOISE teaches a CMOS based VCO circuit including a ring oscillator composed of linked inverters, wherein the number of inverters has a primary effect on determining the oscillation frequency. A control voltage applied to each inverter provides a degree of control over the oscillation frequency. The ring oscillator output is fed into a frequency to voltage converter having a voltage output which is fed into a bias circuit, where the bias circuit output voltage is in turn coupled to the control voltage input for the ring oscillator, thereby providing negative feedback to said oscillator circuit. This negative feedback in turn reduces the phase noise in the VCO output signal.

This VCO topology requires the use of potentially numerous CMOS inverters to provide a specific frequency, and the addition of a frequency to voltage converter and bias circuit to form the negative feedback loop. Additionally, no quantitative information is disclosed as to the actual degree of phase noise reduction provided by this circuit, thus leaving the actual degree of benefit unknown. Further, the component matching requirements of this circuit certainly would require it to be implemented only as an integrated circuit, rather than having the option of implementing it with discrete components.

U.S. Pat. No. 7,414,488 entitled LOW PHASE NOISE DIFFERENTIAL LC TANK VCO WITH CURRENT NEGATIVE FEEDBACK teaches a differential mode oscillator circuit with current mirror controlled biasing circuitry and an LC tank circuit connected to a cross-coupled pair of transistors to induce positive feedback and thus oscillation. A pair of varactors with a common anode connection are used to control the oscillation frequency. A third and fourth transistor are used, one with each of the transistors in the cross-coupled pair, to implement a negative feedback loop for each of the oscillator transistors. The phase noise reduction of this circuit is only −110 dBc/Hz for the frequencies shown. Additionally, the component matching requirements of this circuit certainly would require it to be implemented only as an integrated circuit, rather than having the option of implementing it with discrete components.

A higher-performing VCO circuit would have phase noise reduction greater than −160 dBc/Hz and be suitable for fabrication in a wide variety of technologies, including discrete components, hybrid modules and integrated circuits. Further, such a higher-performing VCO would have a simple design and small component count for more economical fabrication.

SUMMARY

An ultra-low phase noise voltage controlled oscillator (VCO) comprises a resonant circuit electrically connected to an active circuit including at least one transistor connected in a Colpitts oscillator configuration. The transistor has a transistor input node, a positive feedback node, and a negative feedback node. The oscillator output has a circuit path connected to the negative feedback node. The active circuit has a negative feedback path including a first negative feedback element and a second negative feedback element electrically connected in series, wherein the first negative feedback element is electrically connected to the negative feedback node and the second negative feedback element is electrically connected to the transistor input node. At least one of the negative feedback elements is a capacitor. The resonant circuit and the active circuit in combination function as an oscillator circuit wherein phase noise present at the negative feedback node is fed at opposite phase back to the transistor input node, providing extremely high levels of phase noise cancellation.

The other of the negative feedback elements may be either a capacitor, inductor, resistor or even just a shorting connection. No additional components are connected to the node intermediate the first and second negative feedback elements, and the DC biasing circuitry is entirely separate from the negative feedback path. The resonant circuit includes a first resonant circuit capacitor connected to the transistor input node, a second resonant circuit capacitor connected to the first resonant circuit capacitor and to the positive feedback node, a third resonant circuit capacitor connected between the positive feedback node and ground, and a resonant circuit portion connected to the first resonant circuit capacitor. The resonant circuit portion includes a first varactor diode and a second varactor diode, with an inductor connected between the cathodes of the varactor diodes. Other circuit elements of the resonant portion may include inductors, microstrips and ceramic resonators. The varactor diodes provide voltage-controlled capacitance, thereby permitting control over the resonant frequency of the oscillator. A first control voltage is applied to the cathode of the first varactor, thereby controlling the capacitance of the first varactor, and a second control voltage is applied to the anode of the first varactor, thereby permitting modulation of the capacitance of said first varactor. In addition to providing ultra-low phase noise, the negative feedback geometry reduces the odd harmonics output of said oscillator. The VCO circuit can easily be fabricated from discrete components onto a small pc board.

OBJECTS AND FEATURES OF THE INVENTION

It is an object of the present invention to provide a VCO with high frequency phase noise reduction of greater than −160 dBc/Hz.

It is another object of the present invention to provide a VCO capable of being fabricated in a wide variety of technologies.

It is yet another object of the present invention to provide a VCO having a low component count.

It is a further object of the present invention to provide a VCO which can be easily fabricated from discrete components onto a small pc board.

It is a feature of the present invention to have a VCO circuit requiring only a single transistor.

It is another feature of the present invention to have a VCO circuit allowing a variety of component types to be used in the noise-reducing negative feedback loop.

BRIEF DESCRIPTION OF THE DRAWINGS

The present version of the invention will be more fully understood with reference to the following Detailed Description in conjunction with the drawings of which:

FIG. 3 is a chart showing frequency, power, current, Kv, harmonics and pushing for a VCO circuit without phase noise reduction.

FIG. 4 is a chart showing frequency, power, current, Kv, harmonics and pushing for a VCO circuit with negative feedback for ultra-low phase noise.

DESCRIPTION OF THE PREFERRED EMBODIMENTS

Figure 1:
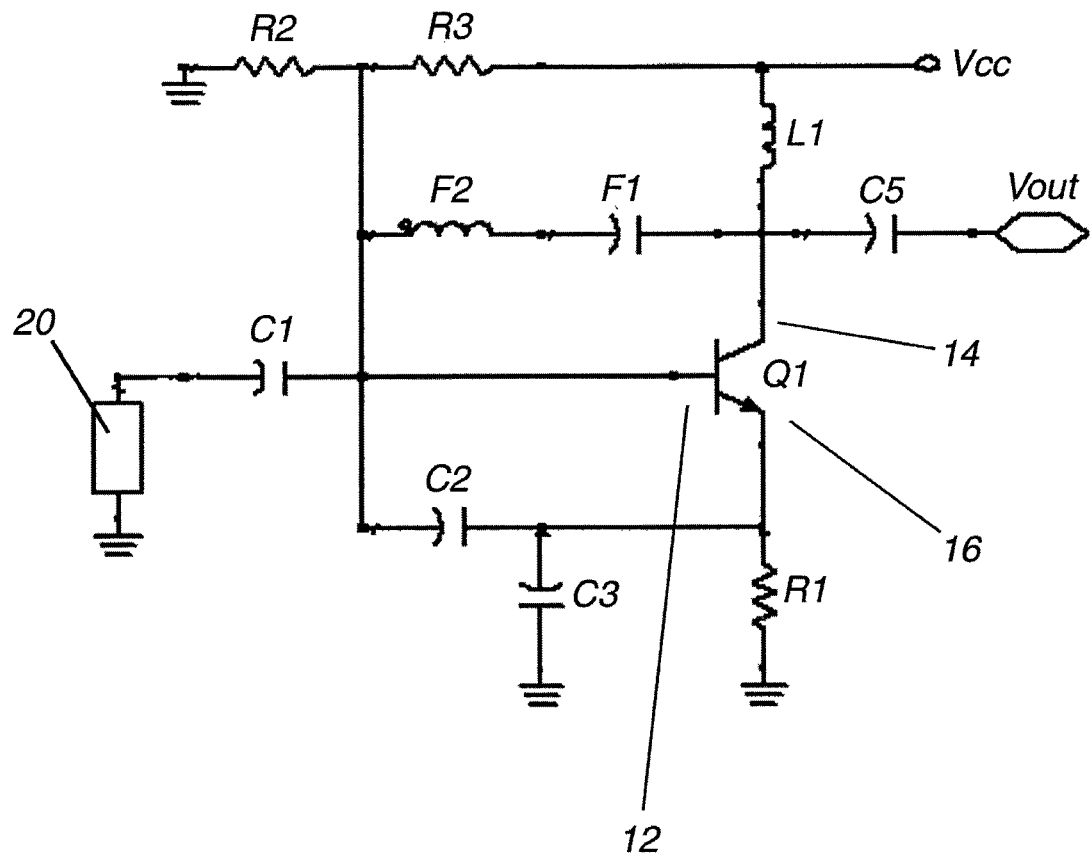
FIG. 1 is a circuit schematic showing the basic ultra-low noise oscillator.

FIG. 1 shows a basic oscillator circuit 10 comprising a Colpitts oscillator based on a single bipolar transistor Q1, having an input node 12, a negative feedback path 14 and a positive feedback path 16. DC biasing is provided by resistors R1, R2 and R3. Capacitor C2 provides the positive feedback path, and in combination with C1, C3 and resonant circuit portion 20 provides the resonance circuit for the oscillator. Inductor L1 is the RF choke and capacitor C5 is an output coupling capacitor. In the preferred embodiment the negative feedback element F1 is a capacitor, and the negative feedback element F2 is an inductor. Negative feedback elements F1 and F2 in series form the negative feedback network. In use, either F1 or F2 can be the capacitor and the other negative feedback element can be either a capacitor, inductor, resistor or even just a shorting connection. Transistor Q1 can be supplemented with multiple transistors in parallel to increase power output.

When a capacitor is used as a feedback element, a higher capacitance or a higher frequency will yield a lower impedance and thus a greater degree of feedback. When an inductor is used as a feedback element, a higher inductance or a higher frequency will yield a higher impedance and thus a lower degree of feedback. The impedance of a resistor is constant versus frequency and thus yields feedback which is constant with frequency and neglecting parasitic effects, solely dependent upon the resistor value such that a higher resistor value will yield a lower degree of feedback. However, a resistor is not recommended for use in the feedback loop due to the presence of inherent resistor noise. A shorting connection can be treated as simply a zero value resistor. Thus, selection of feedback elements for impedance values at specific frequencies contributes to optimization of noise reduction.

Figure 2:
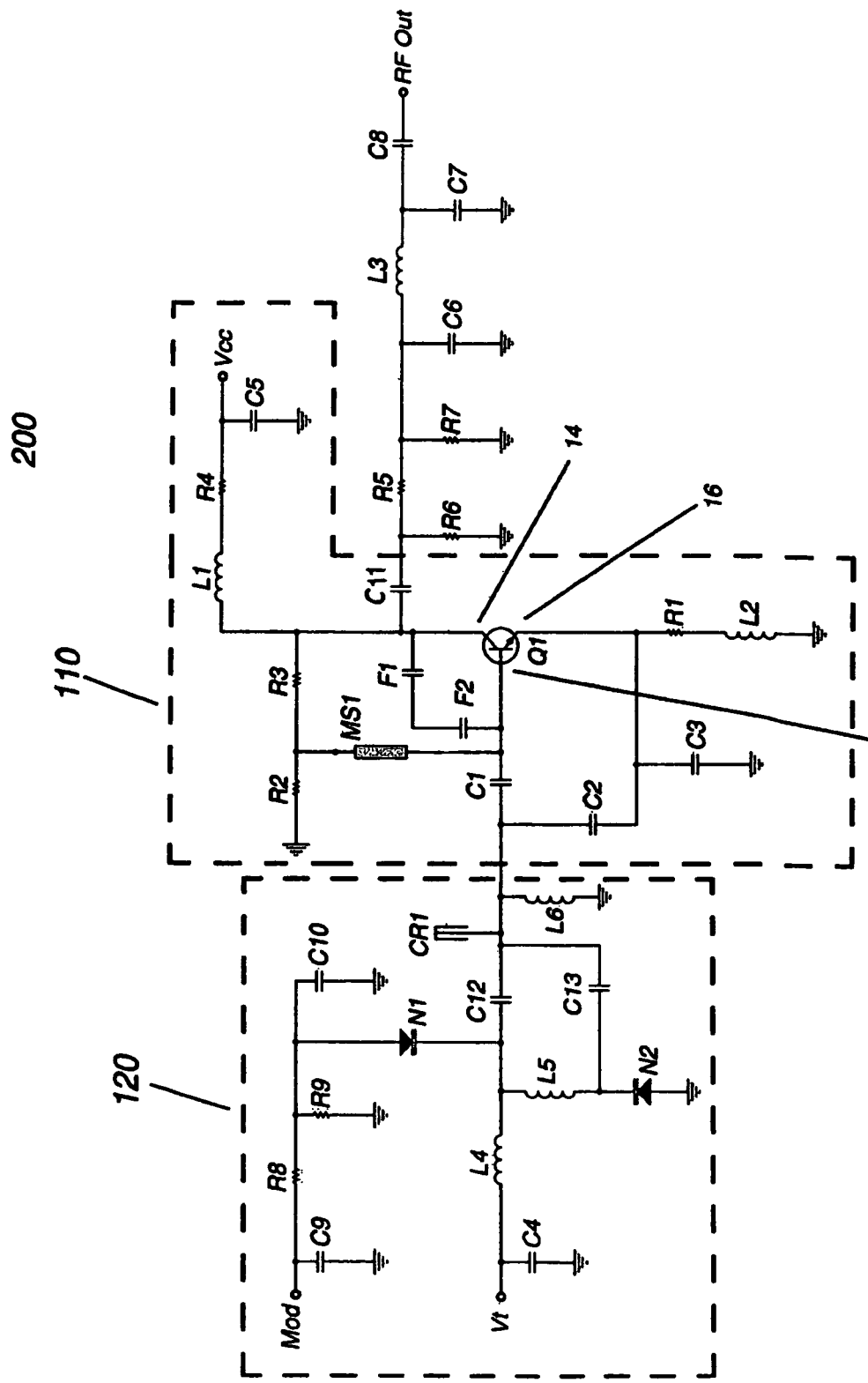
FIG. 2 is a circuit schematic showing the complete ultra-low noise VCO.

The preferred embodiment of the complete VCO circuit 200 is shown in FIG. 2, wherein the oscillator circuit 110 is substantially similar to the basic oscillator circuit 10, and the resonant circuit portion with varactors 120 is a detailed realization of the resonant circuit portion 20. The oscillator circuit 110 includes a second RF choke L2, as well as an additional DC biasing resistor R4 and bypass capacitor C5. Capacitor C2 is connected to the opposite side of C1 than in the basic oscillator circuit 10, but this produces no functional difference to the circuit operation. Also included in the oscillator portion of the complete VCO circuit 200 is a microstrip MS1 which in lieu of an inductor filters the noise of resistors R1 and R2, and thus further improves the phase noise reduction of the VCO.

The resonant circuit portion with varactors 120 provides the voltage control over oscillator resonant frequency. A first control voltage Vt is applied through an RF choke composed of capacitor C4 and inductors L4 and L5 to the cathodes of the first varactor N1 and the second varactor N2. This first control voltage Vt serves to vary the capacitance of the varactors N1 and N2, and thus vary the resonant frequency of the oscillator circuit. Resistors R8 and R9 form a modulation voltage divider for decreasing the modulation amplitude. Resistor R8 also functions as part of an RF choke. Capacitors C9 and C10 function as bypass capacitors for the RF frequency of the VCO and are chosen to have capacitances low enough to not "shunt" the modulation frequency, which is much lower than the VCO frequency. A second control voltage Mod is applied through the network composed of capacitors C9 and C10 and resistors R8 and R9 to the anode of first varactor N1, thereby providing the ability to modulate the capacitance of the first varactor N1 and thus modulate the resonant frequency of the oscillator circuit. Capacitors C12 and C13, along with inductor L6, ceramic resonator CR1, and varactors N1 and N2, set the resonant frequency of the VCO.

The oscillator signal is output through decoupling capacitor C11. Resistors R5, R6 and R7 form an attenuator for isolating the VCO from the output, thereby decreasing the VCO's susceptibility to the output load. Capacitors C6 and C7, plus inductor L3 form a low pass filter and suppress high frequency harmonics of the VCO. Capacitor C8 provides additional decoupling for the RF output terminal RF Out.

Another advantage of the negative feedback geometry of the present invention is that all the odd harmonics of the oscillator are reduced. The phase shift from the transistor input node 12 of transistor Q1 to the negative feedback node 14 for the $n^{th}$ harmonic can be expressed as Phase Shift=n× 180° whereby all the odd harmonics are shifted by 180° and all the even harmonics are shifted by 0°. Thus, the feedback from the negative feedback node 14 to the transistor input node 12 is negative for the odd harmonics including the fundamental, and the odd harmonics power level is greatly reduced.

FIG. 3 shows the VCO performance including phase noise at selected frequencies without the phase noise reduction provided by negative feedback elements F1 and F2, and FIG. 4 shows the VCO performance with the phase noise reduction. As can be seen from a comparison of FIG. 3 and FIG. 4, the ultra-low noise VCO provides a phase noise improvement of 5 dB to 10 dB, and third harmonic suppression of greater than 5 dB.

An alternate embodiment of the present invention has a plurality of transistors connected in parallel for increased output power. Further, while the noise-reducing negative feedback circuitry taught herein is shown as part of a specific Colpitts oscillator based VCO circuit, this noise-reducing negative feedback circuitry can be added to any VCO circuit.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. An ultra-low phase noise voltage controlled oscillator comprising:
   a resonant circuit;
   an active circuit electrically connected to said resonant circuit and including at least one transistor connected in a Colpitts oscillator configuration;
   said transistor having a transistor input node, a positive feedback node, and a negative feedback node;
   a negative feedback path including a first negative feedback element and a second negative feedback element electrically connected in series;
   an oscillator output having a circuit path connected to said negative feedback node;
   said first negative feedback element being electrically connected to said negative feedback node;
   said second negative feedback element being electrically connected to said transistor input node;
   at least one of said negative feedback elements being a capacitor;
   said resonant circuit and said active circuit in combination functioning as an oscillator circuit;
   said resonant circuit includes:
   a first resonant circuit capacitor connected to said transistor input node;
   a second resonant circuit capacitor connected to said first resonant circuit capacitor and to said positive feedback node; a resonant circuit portion connected to said first resonant circuit capacitor;
   said resonant circuit portion further includes a first varactor and a second varactor, said varactors providing voltage-controlled capacitance and thereby permitting control over the resonant frequency of said oscillator;
   an inductor is connected between cathodes of said first varactor and said second varactor, one side of said inductor is connected to said cathodes of said first varactor and another side of said inductor is connected to said cathodes of said second varactor; and
   a first control voltage is applied to said cathodes of said first varactor and said second varactor, thereby controlling the capacitances of said varactors; and
   a second control voltage is applied to the anode of said first varactor, thereby permitting modulation of the capacitance of said first varactor;
   whereby phase noise present at said negative feedback node is fed at opposite phase back to said transistor input node, providing high levels of phase noise cancellation at said oscillator output;
   wherein odd harmonics present at said negative feedback node are subtracted from said odd harmonics present at said transistor input node and thereby reduce the odd harmonic power level present in said oscillator output, adding to the high levels of phase noise cancellation at said oscillator output.

2. The oscillator of claim 1, wherein the other of said negative feedback elements is selected from a group consisting of capacitors, resistors, inductors or shorting jumpers.

3. The oscillator of claim 2, wherein no other circuit elements are connected to the common node between said first negative feedback element and said second negative feedback element.

4. The oscillator of claim 3, further comprising a DC biasing circuit for said transistor having separate current paths from said negative feedback path.

5. The oscillator of claim 3, wherein said resonant circuit further includes:
   a third resonant circuit capacitor connected between said positive feedback node and ground; and
   said resonant circuit portion including elements from the group consisting of inductors, microstrips and ceramic resonators.

6. The oscillator of claim 1, wherein said oscillator being fabricated from discrete components on a printed circuit board.

7. The oscillator of claim 1, wherein said transistor is a plurality of transistors connected in parallel.

8. The oscillator of claim 1, wherein said odd harmonics present at said negative feedback node, including the fundamental, are phase shifted 180 degrees relative to said transistor input node, thereby said odd harmonics, being transmitted through said negative feedback elements at 180 degrees phase shift.

9. An ultra-low phase noise voltage controlled oscillator comprising:
   a resonant circuit;
   an active circuit electrically connected to said resonant circuit and including at least one transistor connected in a Colpitts oscillator configuration;
   said transistor having a transistor input node, a positive feedback node, and a negative feedback node;
   an oscillator output having a circuit path connected to said negative feedback node;
   a first resonant circuit capacitor connected to said transistor input node;
   a second resonant circuit capacitor connected to said first resonant circuit capacitor and to said positive feedback node;
   a third resonant circuit capacitor connected between said positive feedback node and ground;
   a resonant circuit portion connected to said first resonant circuit capacitor, said resonant circuit portion consisting of elements from the group including inductors, resistors, capacitors, varactors, microstrips and ceramic resonators;
   a negative feedback path including a first negative feedback element and a second negative feedback element electrically connected in series;
   said first negative feedback element being electrically connected to said negative feedback node;
   said second negative feedback element being electrically connected to said transistor input node;
   one of said negative feedback elements being a capacitor and the other of said negative feedback elements being selected from the group consisting of capacitors, resistors, inductors or shorting jumpers;
   wherein no other circuit elements are connected to the common node between said first negative feedback element and said second negative feedback element;
   a DC biasing circuit for said transistor having separate current paths from said negative feedback path;
   said resonant circuit and said active circuit in combination functioning as an oscillator circuit;
   said varactors being a first varactor and a second varactor, said varactors providing voltage-controlled capacitance and thereby permitting control over the resonant frequency of said oscillator;
   wherein a first control voltage is applied to the cathodes of said first varactor and said second varactor, thereby controlling the capacitances of said varactors;
   wherein a second control voltage is applied to the anode of said first varactor, thereby permitting modulation of the capacitance of said first varactor; and
   an inductor being connected between said cathodes of said first varactor and said second varactor;
   whereby phase noise present at said negative feedback node is fed at opposite phase back to said transistor input node, providing high levels of phase noise cancellation at said oscillator output;
   wherein odd harmonics present at said negative feedback node, including the fundamental, are phase shifted 180 degrees relative to said transistor input node, thereby said odd harmonics, being transmitted through said negative feedback elements at 180 degrees phase shift, and are subtracted from said odd harmonics present at said transistor input node and thereby reduce the odd harmonic power level present in said oscillator output, adding to the high levels of phase noise cancellation at said oscillator output.

10. The oscillator of claim 9, wherein said transistor is a plurality of transistors connected in parallel.

11. The oscillator of claim 9, wherein said oscillator being fabricated from discrete components on a printed circuit board.

12. The oscillator of claim 9, wherein one side of said inductor is connected to the cathodes of said first varactor and another side of said inductor is connected to said cathodes of said second varactor.

* * * * *